United States Patent
Frigerio et al.

(10) Patent No.: US 12,408,447 B2
(45) Date of Patent: Sep. 2, 2025

(54) DOUBLE PHOTODIODE ELECTROMAGNETIC RADIATION SENSOR DEVICE

(71) Applicants: Politecnico di Milano, Milan (IT); UNIVERSITÀ DEGLI STUDI ROMA TRE, Rome (IT)

(72) Inventors: Jacopo Frigerio, Milan (IT); Giovanni Isella, Milan (IT); Andrea Ballabio, Milan (IT); Andrea De Iacovo, Rome (IT); Lorenzo Colace, Rome (IT)

(73) Assignee: Politecnico di Milano (IT)

( * ) Notice: Subject to any disclaimer, the term of this patent is extended or adjusted under 35 U.S.C. 154(b) by 464 days.

(21) Appl. No.: 18/007,455

(22) PCT Filed: Jul. 29, 2021

(86) PCT No.: PCT/IB2021/056910
§ 371 (c)(1),
(2) Date: Jan. 30, 2023

(87) PCT Pub. No.: WO2022/024025
PCT Pub. Date: Feb. 3, 2022

(65) Prior Publication Data
US 2023/0352613 A1 Nov. 2, 2023

(30) Foreign Application Priority Data
Jul. 31, 2020 (IT) .................. 102020000018760

(51) Int. Cl.
*H10F 30/24* (2025.01)
*H10F 30/221* (2025.01)
(52) U.S. Cl.
CPC ......... *H10F 30/24* (2025.01); *H10F 30/2212* (2025.01)

(58) Field of Classification Search
CPC ....... H10F 30/24; H10F 30/221; H10F 30/222
See application file for complete search history.

(56) References Cited

U.S. PATENT DOCUMENTS

| 5,113,076 A | 5/1992 | Schulte |
| 6,518,558 B1 | 2/2003 | Böhm et al. |

FOREIGN PATENT DOCUMENTS

CN 106531822 A 12/2017

OTHER PUBLICATIONS

De Iacovo Andrea et al., "Design and Simulation of Ge-on-Si Photodetectors With Electrically Tunable Spectral Response", pp. 3517-3525, Jul. 15, 2019, vol. 37, No. 14, Journal of Lightwave Technology.

(Continued)

*Primary Examiner* — Matthew L Reames
(74) *Attorney, Agent, or Firm* — Widerman Malek, PL; Mark Malek; Jonathan Staudt

(57) ABSTRACT

A double photodiode electromagnetic radiation sensor device including a substrate, a first integrated photodiode (PD1), a second integrated photodiode (PD2), and more than one metal contact. The substrate may be within a first semiconductor material that defines a first face and a second face. The PD1 may include a first doped region extending to the second face and a "n-" type doping. The PD1 may further include a second doped region extending to the second face having a "p+" type doping. The PD2 may include the first doped region, and a layer in a second semiconductor material placed on the second face in contact with the first doped region defining a third face. The PD2 may yet further include a doped layer in the second semiconductor material having a "p+" type doping and overlapping the third face.

15 Claims, 8 Drawing Sheets

(56) References Cited

OTHER PUBLICATIONS

Simola E. Talamas et al., "Voltage-tunable dual-band Ge/Si photodetector operating in VIS and NIR spectral range", research article, Mar. 8, 2019, vol. 27, No. 6, Optics Express.

Wilson J A et al., "Integrated Two-Color Detection for Advanced FPA Applications", Proceedings of SPIE, IEEE, US, vol. 2274, Jul. 24, 1994 (Jul. 24, 1994), p. 117-125.

DOUBLE PHOTODIODE ELECTROMAGNETIC RADIATION SENSOR DEVICE

RELATED APPLICATIONS

This application is a national phase application of and claims priority under 35 U.S.C. § 371 of PCT Application Serial No. PCT/IB2021/056910 filed on Jul. 29, 2021 and titled DOUBLE PHOTODIODE ELECTROMAGNETIC RADIATION SENSOR DEVICE, which in turn claims priority of Italian Patent Application No. 102020000018760 filed on Jul. 31, 2020 and titled DOUBLE PHOTODIODE ELECTROMAGNETIC RADIATION SENSOR DEVICE. The content of these applications is incorporated herein by reference.

TECHNICAL FIELD

The present invention relates to electromagnetic radiation sensors of the double photodiode type.

STATE OF THE ART

Double photodiode electromagnetic radiation sensors allow the detection of an optical signal in two different spectral bands.

The first demonstration of how the use of two photodiodes in a back-to-back configuration allows the detection of an optical signal in two different spectral bands is reported in the article J. C. Campbell et al. "Dual-wavelength demultiplexing InGaAsP photodiode," Applied Physics Letters 34, 401 (1979).

This paper describes the use of two layers of InGaAsP (with different concentrations of the individual chemical elements) as photosensitive elements in the 0.8-1.1 µm and 1.0-1.3 µm bands. The structure is deposited on an InP substrate and has three independent metal contacts.

The paper E. R. Blazejewski et al, "Bias switchable dual band HgCdTe infrared photodetector," J. Vac. Sci. Tech. B, 10, 1626 (1992) describes a back-to-back configuration used to manufacture a mid-infrared and far-infrared active optical sensor using two HgCdTe alloys deposited on a CdZnTe substrate as active layers. In this case the device is photosensitive in the 2-4.3 um and 4.5-8.2 um bands.

Paper L. Colace et al, "Solid state wavemeter with InGaAsP/InGaAs two-diode heterostructure," Electronics Letters 38,735 (2002) describes a back-to-back structure using two layers of InGaAsP with different band gaps deposited on InP to measure the wavelength of a laser in the 30 nm range.

Document U.S. Pat. No. 6,342,720 describes a photodetector comprising a double diode consisting of a silicon Schottky diode and a PIN-type SiGe diode.

Document U.S. Pat. No. 6,043,517 discloses a photodetector that operates for two wavelength ranges and comprises two detectors arranged one above the other. A silicon Schottky diode forms a first detector that absorbs light with wavelengths shorter than 0.9 µM. A second detector (a Si/SiGe diode) absorbs light with wavelengths greater than 11 µM and less than 2 µm.

The paper E. Talamas Simola et al. "Voltage-tunable dual-band Ge/Si photodetector operating in VIS and NIR spectral range" Vol. 27, No. 6; 18, Mar. 2019, OPTICS EXPRESS 8529, describes a device having a germanium-on-silicon epitaxial structure consisting of two photodiodes connected back-to-back and such that it operates as a photodetector for a wide band of wavelengths.

SUMMARY OF THE INVENTION

The present invention addresses the problem of providing an electromagnetic radiation sensor, of the two-photodiode type in a back-to-back configuration, which has an alternative structure to the known ones, without being of complex manufacturing and which is compatible with the processing techniques of CMOS electronics allowing, consequently, the integration of the sensor with the electronic control and readout modules of the sensor itself.

In accordance with a first aspect, the present invention relates to a double photodiode electromagnetic radiation sensor device as defined in independent claim 1 and to particular embodiments thereof as defined in dependent claims 2-13.

According to a second aspect, the present invention has as its object an electromagnetic radiation detection system according to claim 14 and by a particular embodiment thereof, as defined by dependent claim 15.

BRIEF DESCRIPTION OF THE DRAWINGS

The present invention is hereinafter described in detail, by way of example and not limitation, with reference to the accompanying drawings, in which.

DETAILED DESCRIPTION

Figure 1:
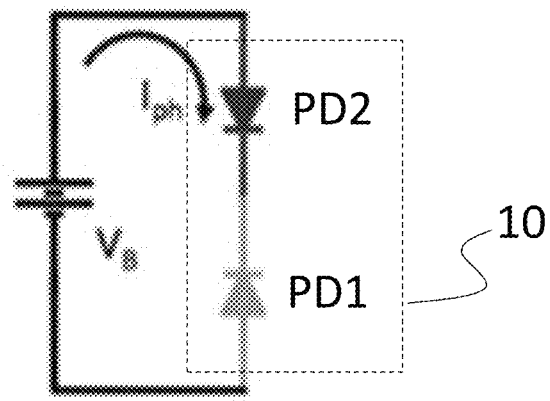
FIG. 1 shows the circuit diagram of a two-photodiode sensor device in back-to-back configuration.

In this description, similar or identical elements or components will be indicated in the drawings by the same identifying symbol.

FIG. 1 shows a circuit scheme of a double photodiode sensor device 10 (also referred to herein as "sensor" for brevity). The sensor 10 includes a first photodiode PD1 and a second photodiode PD2 arranged in a "back-to-back" configuration i.e., with cathodes (or anodes) electrically connected to each other. These first and second photodiodes PD1 and PD2 are adjustable by applying a suitable voltage VB to the remaining anodes (or cathodes).

In particular, the first photodiode PD1 (hereinafter, also referred to as "PD1 diode") is obtained from a semiconductor material with energy gap (i.e., band gap) $E_{g1}$ and the second photodiode PD2, is obtained from another semiconductor material with energy gap $E_{g2} < E_{g1}$.

The first diode PD1 is configured to collect and convert into an electrical signal (i.e., a photocurrent Iph) the radiation with wavelength λ between a first minimum wavelength $\lambda_{min}(PD1)$ and a first maximum wavelength $\lambda_{max}(PD1) = hc/E_{g1}$ (with hc universal constants).

The second photodiode PD2 (hereafter also called "PD2 diode") is configured to collect and convert into an electrical signal (a corresponding photocurrent Iph) the radiation with wavelengths ranging from a second minimum wavelength $\lambda_{min}(PD2)$ to a second maximum wavelength $\lambda_{max}(PD2) = hc/E_{g2}$ with $\lambda_{min}(PD2) < \lambda_{max}(PD1)$.

As an example in the case of silicon, indicative values of $\lambda_{min}(PD1)$ and $\lambda_{max}(PD1)$ are 400 nm and 1100 nm, respectively, and in the case of germanium, indicative values of $\lambda_{min}(PD2)$ and $\lambda_{max}(PD2)$ are 400 nm and 1800 nm, respectively.

Figure 3:
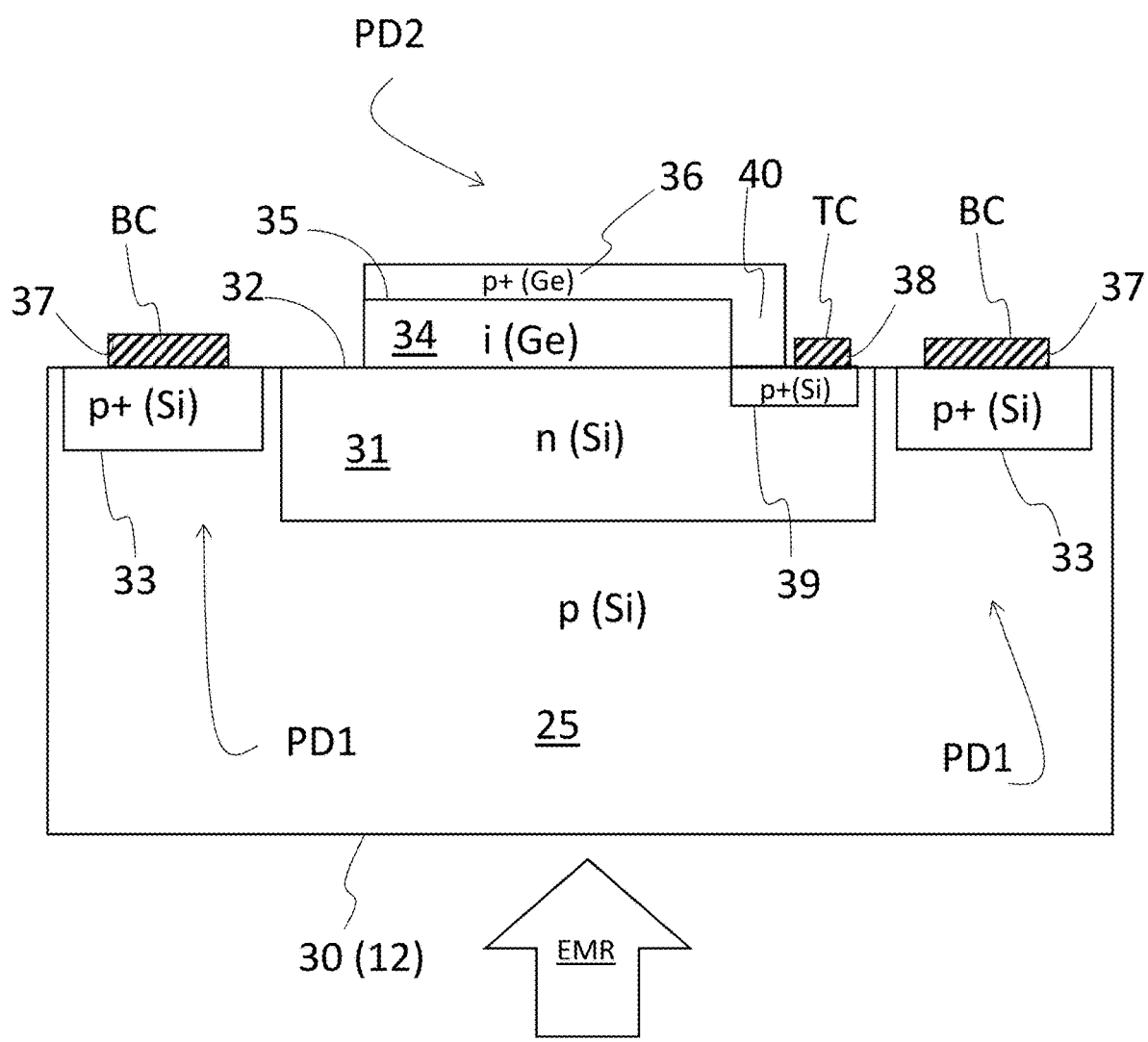
FIG. 3 shows, according to a first embodiment, a cross section of the structure of the sensor device integrated in a substrate of semiconductor material.
Figure 4:
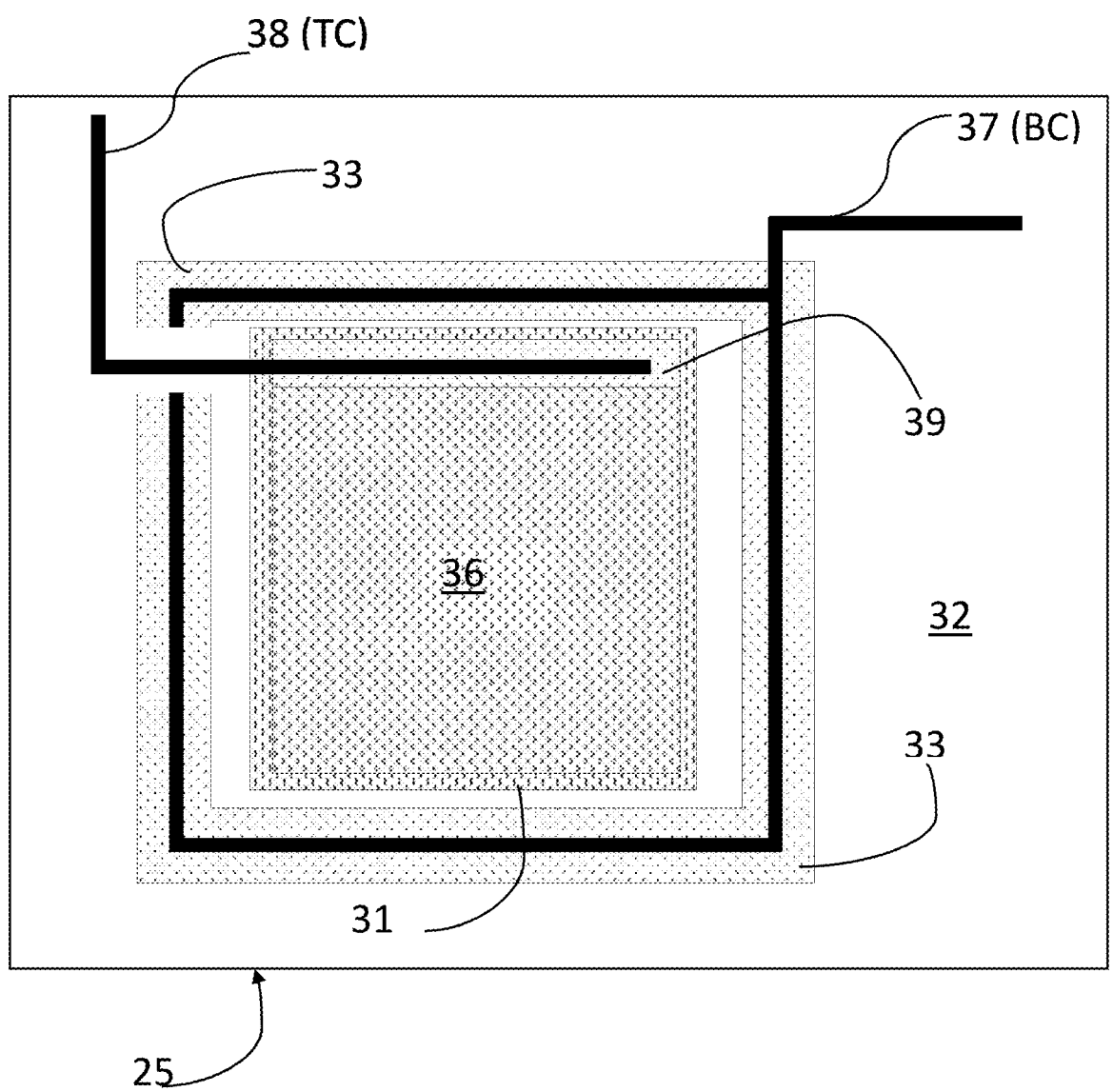
FIG. 4 shows a plan view of the structure of the sensor device of the first embodiment.

An exemplary embodiment of the sensor structure 10 is illustrated in FIGS. 3 and 4 (in which the various layers represented are not necessarily to scale). In the following description, reference will be made, by way of example, to the materials silicon and germanium.

As shown in FIG. 3 and FIG. 4, the sensor 10 includes a substrate 25 made of a first semiconductor material (in the example, shown, silicon) having, for example, p-type doping. The substrate 25 defines a first face 30 and an opposing second face 32.

The first face 30 constitutes an exposed region from which the electromagnetic radiation EMR penetrates. Note that the substrate 25 of the sensor 10 in FIG. 3 may be n-type.

A first doped region 31 is formed in the substrate 25, of the same material as the substrate, but with a doping opposite to that of the substrate 25 and that is, according to the example, with an n-type doping. The first doped region 31 extends from the second face 32 of the substrate 25 towards the interior of the substrate itself, without reaching, the first face 30.

Note that said first doped region 31 is intended to act as a common electrode (according to the example, a cathode) to the first diode PD1 and the second diode PD2.

A second doped region 33 is formed within the substrate 25 having, according to the example, a doping of the same type as the substrate 30 but higher, i.e., a p+ type doping. The second doped region 33 extends from the second face 32 toward the interior of the substrate 25 without reaching the first face 30, with a depth less than, for example, that of the first doped region 31.

For example, the second doped region 33 is developed within the substrate 25 so as to laterally surround, in an open loop, the first doped region 31.

Note that the second doped region 33 is intended to act as an additional electrode (in this example, as an anode) for the first PD1 diode.

Further, the sensor 10 includes a layer made of a second semiconductor material 34 (made of germanium, according to the example) placed on the second face 32 of the substrate 25 and so as to be in contact with the first doped region 31. Said germanium layer 34 is, for example, intrinsic germanium. The germanium layer 34 is such as to define a third face 35 opposed to the second face 32.

For example, the intrinsic germanium layer 34 results in facing part of the first doped region 31 (in particular, a central portion thereof), without entirely covering it.

Note that, according to the example, the germanium layer 34 is intended to operate as an intrinsic layer of the second PD2 diode.

Over the third face 35 of the intrinsic germanium layer 34 is placed a doped layer 36 (in germanium) having, according to the example, a high p-type doping (i.e., a p+ doping). The doped layer 36 is intended to act as an anode for the second diode PD2.

The sensor 10 has metal contacts arranged to contact the second doped region 33 at said second face 32 and the doped layer (36).

In particular, according to the embodiment form of FIG. 3, the sensor 10 is provided with a first metal layer 37 arranged above second doped region 33 (i.e., the anode of the first diode PD1), so as to form a first ohmic contact BC.

Further, the sensor 10 includes a second metal layer 38 that forms a second ohmic contact TC electrically connected to the doped layer 36.

According to this first embodiment, the connection between the second ohmic contact TC and the doped layer 36 (i.e., the anode of the second PD2 diode) is made by means of a first high-doped well 39 (i.e., a high-conductivity well) and a second high-doped well 40.

The first high-doped well 39 extends from the second face 32 inwardly into the first doped region 31 (n-type) and has, according to the example, a p+ doping. The second ohmic contact TC is disposed on the second face 32 in contact with a portion of the high doping well 39.

The second high-doped well 40 extends, within the germanium layer 34, from the doped layer 36 (with which it is in contact) to the first high-doped well 39 at the second face 32. According to the example, the second high-doped well 40 is made of p+ doped germanium.

Summarizing, the first diode PD1 comprises the first doped region 31, a portion of the substrate 25, and the second doped region 33. The second diode PD2 comprises the first doped region 31, the intrinsic germanium layer 34, the doped layer 36, and the first and second high-doped wells 39 and 40.

The sensor 1 can be manufactured using conventional semiconductor material integration techniques that are compatible with CMOS integration techniques.

For example, the first doped region 31, the second doped region 33, the doped layer 36, the first high dopant well 39, and the second high dopant well 40 may be formed by implantation techniques and/or by spin-on dopant and/or deposition techniques (including epitaxy, sputtering, evaporation).

The intrinsic germanium layer 34 may be formed by chemical and/or physical deposition techniques such as: epitaxy, sputtering, evaporation or even transfer as wafer bonding.

For example, the intrinsic germanium layer 34 may be 500 nm to 3 μm thick. In accordance with the example, the doped layer 36 (i.e., the anode of the second PD2 diode) may be 5 to 200 nm thick.

The intrinsic germanium layer 34 is entirely within the first doped region 31 of the silicon substrate 25 and, therefore, it is possible to deposit the intrinsic germanium layer 34 by techniques such as selective deposition (e.g., oxide window deposition), or it is possible to deposit the germanium layer 34 over the entire substrate 25 and then define the geometry of the layer 34 itself by selective removal techniques (photolithography).

The first diode PD1, being made of silicon, is such as to collect and convert into an electrical signal (i.e., the current Iph) the radiation in the visible and near infrared and then the radiation having, indicatively, a minimum wavelength $\lambda_{min}$(PD1) of 400 nm and a maximum wavelength $\lambda_{max}$(PD1) of 1100 nm. The VIS (Visible) band is, as known, included in the wavelength range 400 nm-700 nm. The Near InfraRed (NIR) band extends from 700 nm to 1100 nm.

The second diode PD2 made at least partially of germanium, is configured to collect and convert into an electrical signal (i.e., the current Iph) the radiation having, indicatively, minimum wavelength $\lambda_{min}$(PD2) 400 nm and maximum wavelength $\lambda_{max}$(PD2) of 1800 nm.

As known, the near infrared (NIR) band extends from 700 nm to 1100 nm, while the short wave infrared (SWIR) band is included in the wavelength range 1100 nm-3000 nm.

In other words, the sensor 10, when fabricated using silicon for the PD1 photodiode and germanium for the PD2 photodiode as shown in the particular embodiment form in FIG. 3, can operate in the visible, near infrared to part of the short wave infrared.

Regarding the operation of sensor 10, note that the bias voltage VB is conventionally understood as the voltage difference between the second ohmic contact TC and the first ohmic contact BC. According to this definition, for positive bias voltages VB, the second diode PD2 biases directly and the first diode PD1 biases inversely, and vice versa for negative voltages VB.

When the sensor 10 is illuminated on the side of the semiconductor with energy gap $E_{g1}$ (i.e., at the first face 30 of the diode PD1, according to the example), the first photodiode PD1 will absorb the portion of the higher energy light radiation and the second photodiode PD2 will be illuminated by the only light radiation that cannot be absorbed by the gap semiconductor $E_{g1}$.

The photodiode made with the gap semiconductor $E_{g1}$ (i.e. the first diode PD1) is, therefore, able to generate photocurrent only in the presence of light radiation at low wavelength ($\lambda < hc/E_{g1}$, with hc universal constants) while, on the contrary, the second photodiode PD2 responds only to photons with wavelength λ greater than λmax(PD1) and less than λmax(PD2):

$$\lambda_{max}(PD1) < \lambda < \lambda_{max}(PD2).$$

The total photocurrent generated by sensor 10 will be given by the difference between the photocurrents generated by the two different photodiodes PD1 and PD2.

This photocurrent Iph can be measured by connecting to the first and second ohmic contacts BC and TC with a corresponding electronic conditioning and acquisition system.

More in detail, when the first diode PD1 is inversely biased it is able to generate the photocurrent Iph when illuminated with radiation with wavelength λ between $\lambda_{min}$(PD1) and $\lambda_{max}$(PD1), while the second diode PD2 is directly biased and is therefore optically inactive, but allows the circulation of the current Iph.

Vice versa, when the second diode PD2 is reverse biased it is able to generate the photocurrent Iph (if illuminated with radiation wavelength λ between $\lambda_{max}$(PD1) and $\lambda_{max}$(PD2), while the first diode PD1 is direct biased and is therefore optically inactive, but allows the circulation of the current Iph.

Figure 2:
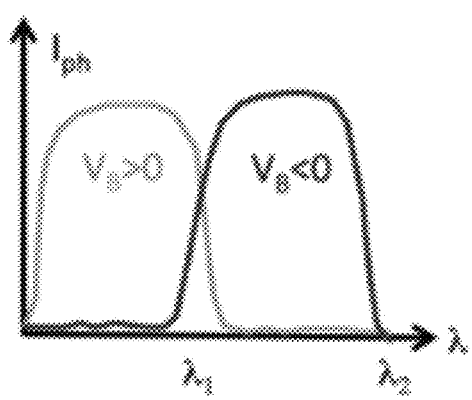
FIG. 2 shows, as an example, the trend of the current generated by the sensor device as a function of wavelength and regulation voltage.

Acting on the bias voltage VB it is possible to electrically select the spectral response of the sensor 10. FIG. 2 shows, as an example, the trend of the current Iph as a function of wavelength, for two extreme values of the bias voltage $V_B$.

Depending on the applied bias voltage VB it will be possible to change the collection efficiency of the two junctions associated with the two diodes PD1 and PD2; in particular, as the collection efficiency of the junction with gap $E_{g1}$ increases, it will be observed a decrease in the collection efficiency of the junction with gap Egg and vice versa. This approach allows the responsivity spectrum of sensor 10 varying continuously.

It should be noted that although silicon and germanium were referred to in the example of FIG. 1, the sensor 10 may be manufactured by other semiconductor materials. For example, other possible materials capable of satisfying the aforementioned relationships between the photoresponse bands of the first diode PD1 and/or the second diode PD2 include semiconductor materials chosen from one of the following types:

a) III-V semiconductors (e.g., GaAs, InAs, InP) and alloys thereof;

b) II-VI semiconductors (e.g., ZnSe, ZnTe, CdSe, CdTe, HgTe, PbS, PbSe) and their alloys;

c) IV semiconductors (e.g., Si, Ge, GeSn) and their alloys.

The form of realization of the sensor 10 described above is not complex to manufacture and, in addition, has the advantage of presenting the metal contacts of the sensor on the same side of the substrate 25 in which it is integrated resulting, therefore, of "planar" type.

The flatness of the sensor device 10 allows its monolithic integration on silicon substrates in which there are other electronic circuits made with CMOS processing techniques. In this way it is possible to realize simultaneously the sensor device and the electronic conditioning and acquisition system on the same substrate, using similar processing technologies that represent an industry standard.

Even when only the sensor device is fabricated on a silicon substrate, the presence of metal contacts TC and BC placed on the same face of the device facilitates the subsequent connection of the latter to external circuits and electronic systems for conditioning and acquisition of the photocurrent signal.

In the latter case, the sensor device 10 can be connected to the external circuitry by means of micro-soldering techniques (bump-bonding, wire bonding, Cu—Cu bonding) or through an electronic connection board (PCB), as will also be specified later.

Figure 5:
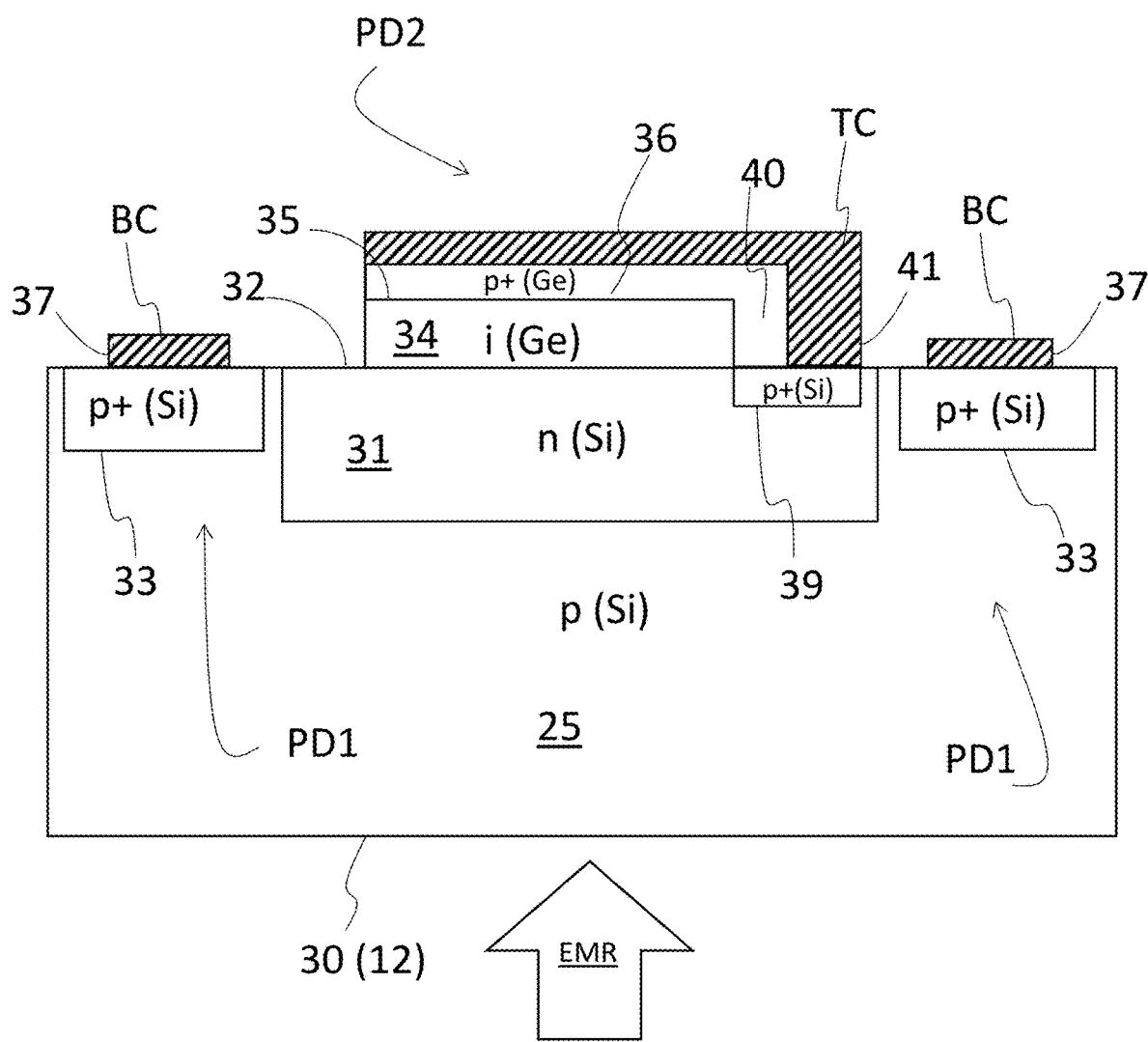
FIG. 5 shows, in accordance with a second embodiment, a cross-section of a structure of said sensor device integrated into a substrate of semiconductor material.

FIG. 5 refers to a second embodiment of the sensor 10, similar to that of FIGS. 3 and 4 but in which the second ohmic contact TC is made by means of a metal layer 41 covering the doped layer 36 (p+, Ge) and the second high-doped well 40, contacting the first high-doped well 39 at the second face 32. In this case, the second TC ohmic contact results directly connected to the doped layer 36 and the second high-doped well 40 as well, providing a better distribution of the electric field within the second PD2 photodiode and decreasing the series resistance effects.

Figure 6:
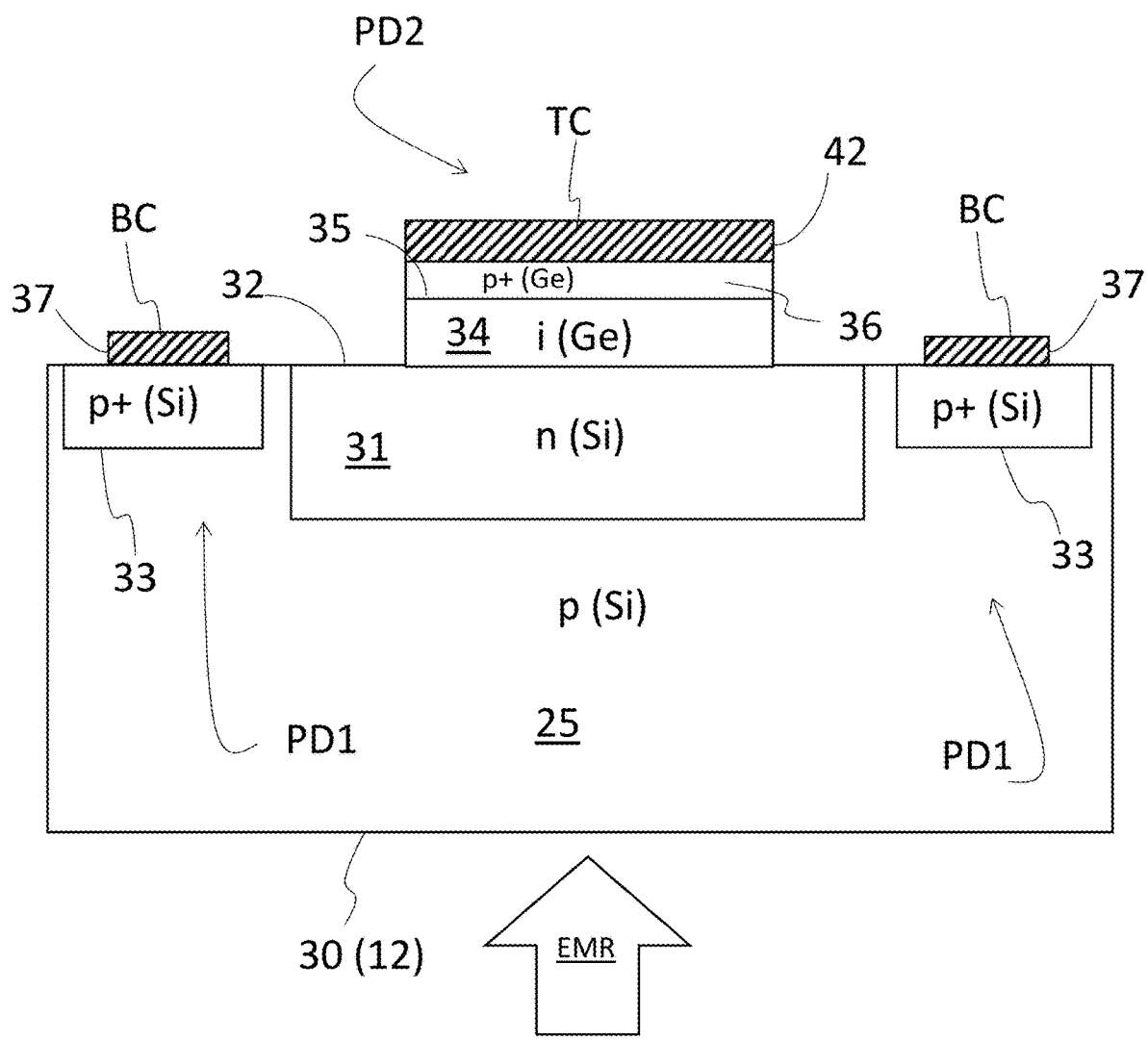
FIG. 6 shows, in accordance with a third embodiment, a cross-section of a structure of said sensor integrated in a substrate of semiconductor material.

FIG. 6 relates to a third embodiment of sensor 10, similar to that of FIGS. 3 and 4, but in which the first and second high-doped wells 39 and 40 are not provided. In the embodiment form of FIG. 6, the second TC ohmic contact is made by means of a fourth metal layer 42 that covers the doped layer 36, resulting in spacing from the second face 32. In this case, the absence of the high doping wells 39 and 40 allows further simplification of the fabrication process of the sensor device.

Figure 7:
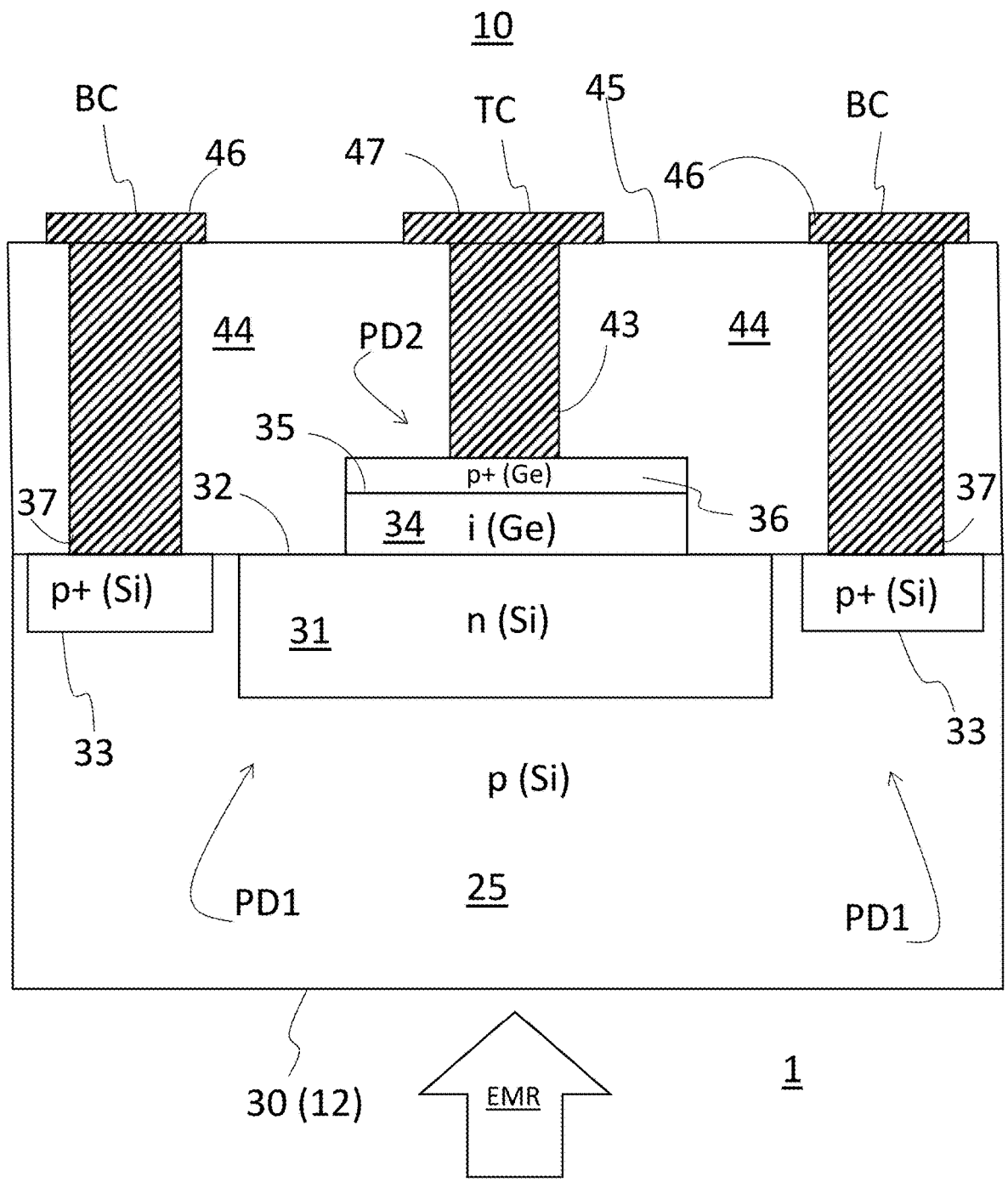
FIG. 7 shows, in accordance with a fourth embodiment, a cross-section of a structure of said sensor integrated in a substrate of semiconductor material.

FIG. 7 refers to a fourth embodiment of the sensor 10, which is similar to the third embodiment of FIG. 6 but in which the second ohmic contact TC is obtained by means of a fifth metal layer 43 that only partially covers the doped layer 36.

Furthermore, according to the fourth embodiment of the sensor 10, the first metal layer 37 (forming the first ohmic contact BC) and the fifth metal layer 43, (forming the second ohmic contact TC) are vertically extended within an insulating layer 44 (e.g., silicon dioxide) arranged to cover part of the second face 32 and part of the doped layer 36.

In particular, the first metal layer 37 and the fifth metal layer 43 form, on a free face 45 of the insulating layer 44, a first contact pad 46 and a second contact pad 47, respectively.

This fourth embodiment allows all the metal contacts to be made at the same height in correspondence with the free face 45; consequently, connection of the sensor device 10 to any external electronic systems is easier due to the absence of differences in height between the various metal contacts.

Figure 8:
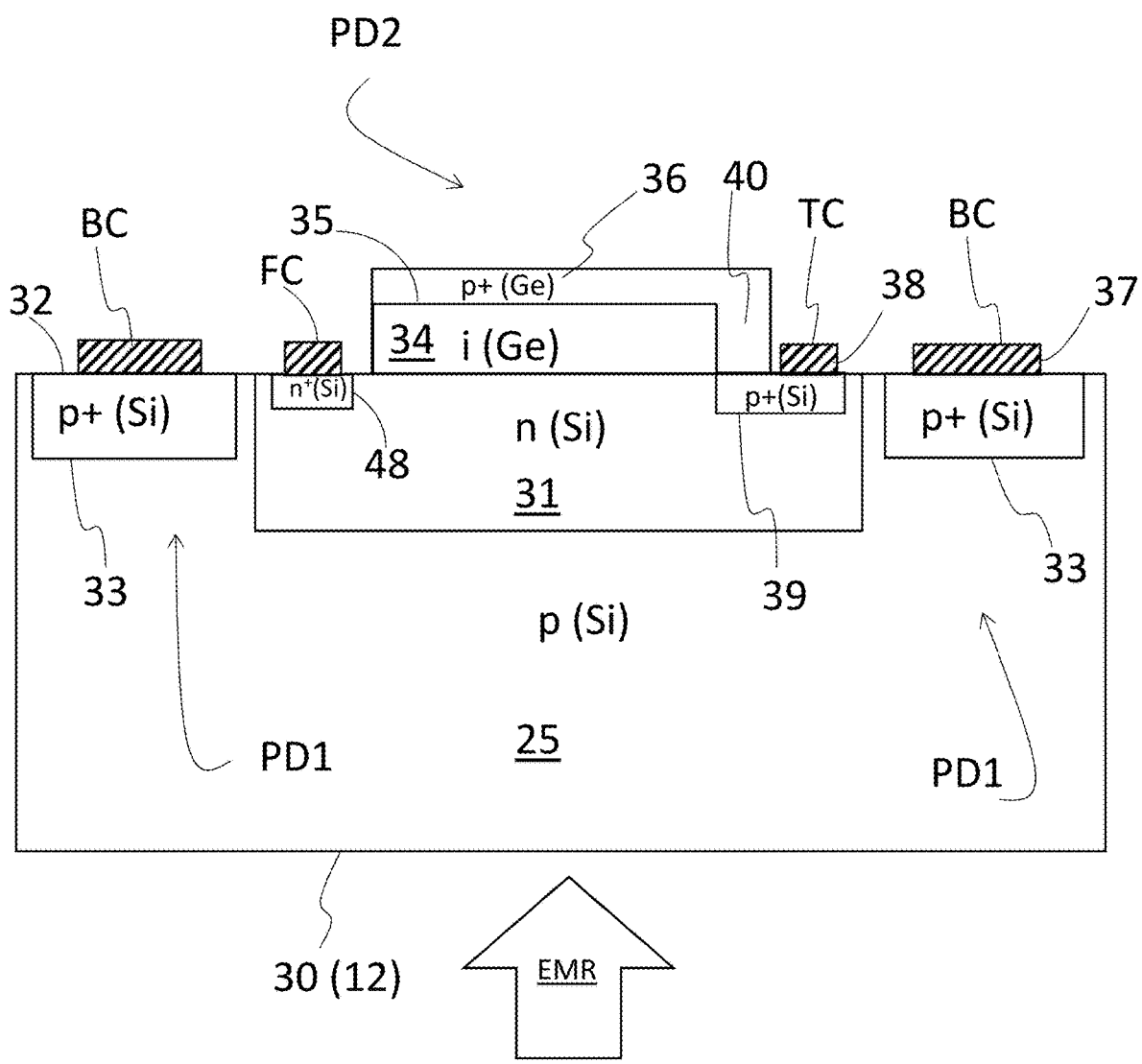
FIG. 8 shows, in accordance with a fifth embodiment, a cross-section of a structure of said sensor integrated in a substrate of semiconductor material FIG. 9 schematically shows a spectrum detection system including said sensor device.

FIG. 8 refers to a fifth embodiment of the sensor 10, similar to the first embodiment in FIG. 3 but further comprising a third ohmic contact FC (electrically isolated from the first and second ohmic contacts BC and TC), made by a corresponding metal layer.

Said third ohmic contact FC extends on the second face 32 above a third high-doped well 48. The third high-doped well 48 is, according to the example, made of silicon and is made internally to the first doped region 31, presenting a higher doping but of the same type as that of the first doped region 31, i.e., according to the example, an n+ doping.

The third ohmic contact FC, placed in contact with the first doped region 31 (which acts as a cathode for the first diode PD1 and second diode PD2), offers the advantage of allowing to bias the two photodiodes PD1 and PD2 independently of each other, allowing to acquire two different photocurrent signals, for example: one related to the VIS band (PD1) and the other related to the NIR-SWIR band (PD2).

Regarding the possible uses, the sensor 10 can be employed to realize a camera capable of acquiring images in two different bands (for example, in the VIS-NIR and in the SWIR). In addition, sensor 10 can be used in a spectrum detection system for the purpose of spectral analysis of incident radiation or to realize a hyperspectral imaging sensor system.

For example, for the realization of the two-band imaging camera or the hyperspectral imaging sensor system, a plurality of sensors 10 having a structure similar to that described above can be integrated into the same substrate 25, resulting side-by-side and forming a two-dimensional array.

Figure 9:
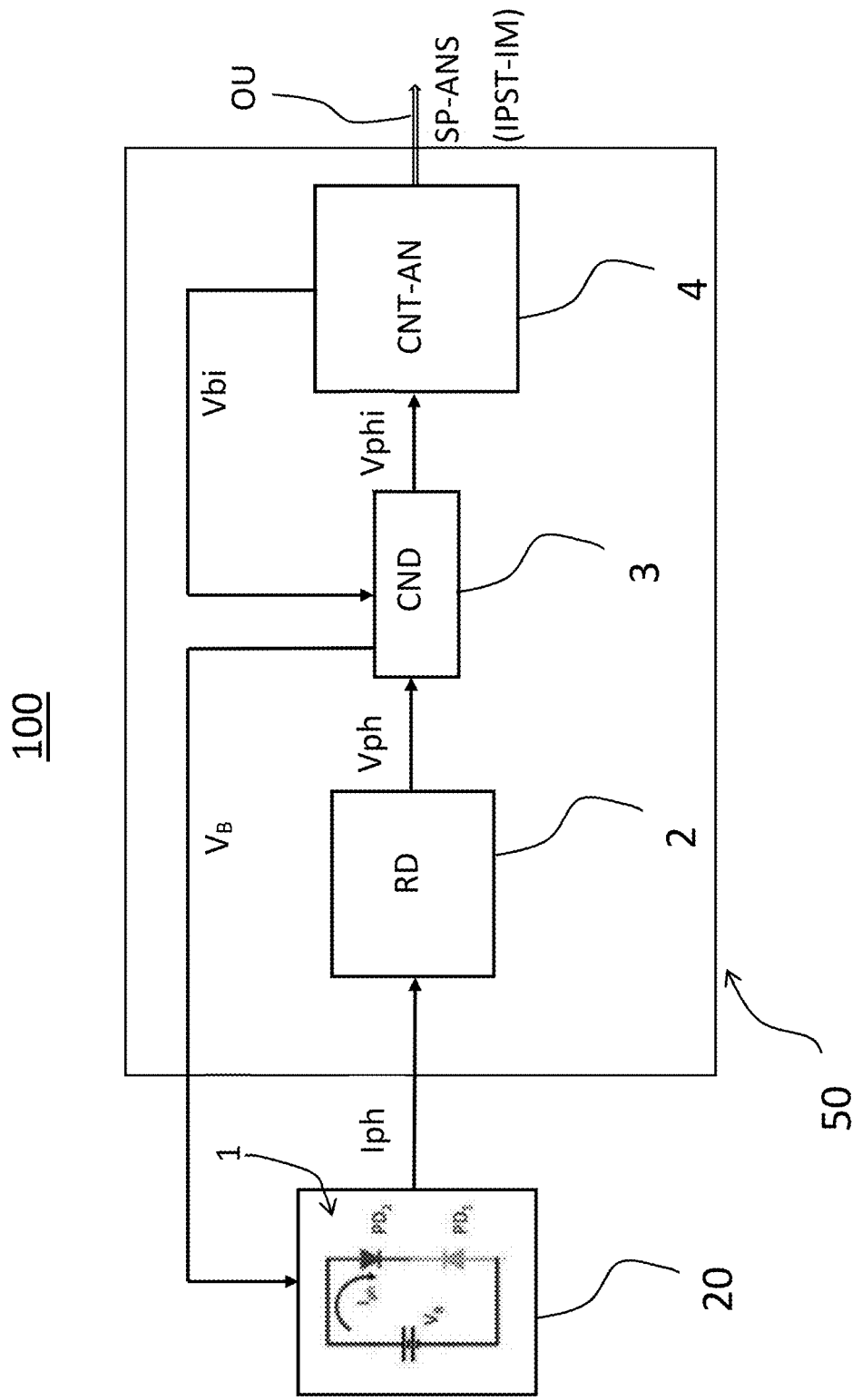

With reference to these possible applications, FIG. 9 illustratively shows a spectrum detection system 100 comprising an electromagnetic radiation sensor apparatus 20 and an electronic control and processing module 50. In more detail, the electronic control and processing module 50 is configured to extract and provide on an output OU information related to the spectrum of radiation invading the sensor 10. The electronic control and processing module 50 includes a readout module 2 (RD), a conditioning module 3 (CND), and an analysis and control device 4 (CNT-AN).

According to a first embodiment, described below, the spectrum detection system 100 may be configured to perform spectral analysis of an electromagnetic radiation by providing on the output OU information SP-ANS relating to the measurement of the intensity of the incident radiation as a function of wavelength.

The electromagnetic radiation sensor apparatus 20 includes the sensor device 1. For the purpose of spectral analysis of electromagnetic radiation, the sensor apparatus 20 may include a single sensor 10. With respect to the control and processing module 50, note that the readout module 2 is configured to convert the current signal Iph to a voltage signal Vph and includes, for example, a trans-impedance amplifier (not shown).

The conditioning module 3 is configured to treat the voltage signal Vph so as to make it suitable for subsequent processing. For example, the conditioning module 3 performs operations such as amplification, filtering, level adaptation, dark current cancellation, and an analog-to-digital conversion of the voltage signals Vph to digital values Vphi.

The analysis and control device 4 is configured to receive digital values Vphi representative of the voltage signals Vph, corresponding to the photocurrent signals generated by the sensor 10 for various bias voltages VB, and perform a spectral analysis of the radiation invading the sensor 1. The analysis and control device 4 may include programmable logic (e.g., ASIC/FPGA) configured to perform such a spectral analysis.

In addition, the analysis and control device 4 is configured to generate digital voltage values Vbi which, through appropriate conditioning (which can be performed by the conditioning module 3) are transformed into analog values of the bias voltage VB to be applied to the sensor 1 to vary its spectral response.

For example, the control and processing module 50 is a ROIC (ReadOut Integrated Circuit) that can be directly integrated into the substrate 25 used to make the sensor 10. Alternatively, the sensor 10 and the ROIC 50 can be made on two different substrates and then connected via bump-bonding or wafer-bonding techniques. Alternatively, sensor 1 and ROIC 50 may be fabricated on different substrates and then connected via a PCB.

As already described, the sensitivity spectrum of sensor 10 can be continuously modified; in particular, several spectral responses intermediate to the extreme ones (obtainable by applying the maximum or minimum bias voltage) shown in FIG. 2 can be obtained.

This property offers the possibility of obtaining a large number of spectra, dynamically tunable, through the application of the bias voltage VB and extended in the visible and near-infrared range, allowing the realization of a compact spectral analysis system.

Note that the spectral analysis is based on the knowledge of the spectral responsivity of the sensor 10, this spectral responsivity is determined in a characterization step.

In accordance with another embodiment of the system 100, the system can be configured to operate as a hyperspectral imaging system, i.e., a hyperspectral imaging system IPST-IM. In this case, the sensor apparatus 20 includes a plurality of sensor devices 10, similar to the sensor described above, organized according to a matrix. For example, the sensor apparatus 20 may include millions of sensors 10 each corresponding to a pixel of the hyperspectral image to be acquired.

The electronic control and processing module 50 is, in this case, configured to receive the photocurrents Iph provided by each sensor 1 (corresponding to a pixel) and process them to obtain the hyperspectral image, in which for each pixel the image spectrum of a scene is provided.

The Spectrum 100 detection system is used, for example, in the automotive sector (Fog, Night Vision, augmented vision), in the Machine Vision sector (Industry 4.0, increased machine vision) or in the plastics recycling sector.

LIST OF THE FIGURE NUMBERS sensor device 10
spectrum detection system 100
electromagnetic radiation sensor 20
electronic control and processing module 50
output OU
reading module 2
conditioning module 3
analysis and control device 4
First photodiode PD1
Second photodiode PD2
bias voltage VB
photocurrent Iph
Voltage signal Vph
digital voltage values Vbi
substrate 25
first ohmic contact BC
second ohmic contact TC
first face 30
first doped region 31
second face 32
second doped region 33
layer in a second semiconductor material 34
third face 35
doped layer 36
first metallic layer 37
second metallic layer 38
first high doping pocket 39
second high doping pouch 40
third metal layer 41
fourth metal layer 42
fifth metal layer 43
insulating layer 44
free face 45
first contact pad 46
second contact pad 47
third ohmic contact FC
third high doping pocket 48

The invention claimed is:

1. A double photodiode electromagnetic radiation sensor device comprising:
   a substrate with in a first semiconductor material defining
      a first face exposed to electromagnetic radiation (EMR) and a second face opposite the first face;
   a first integrated photodiode comprising:
      a first doped region included in the substrate extending to the second face and having a first type doping (n); and
      a second doped region included in the substrate extending to the second face, separated from the first doped region by a portion of the substrate, the second doped region having a doping of a second type (p+);
   a second integrated photodiode (PD2) comprising the first doped region, and further comprising:
      a layer in a second semiconductor material placed on the second face in contact with the first doped region and such as to define a third face opposed to the second face; and
      a doped layer in the second semiconductor material having a doping of the second type (p+) and overlapping the third face; and
   a plurality of metal contacts (BC, TC) arranged to contact the second doped region, at the second face, and the doped layer.

2. The device according to claim 1, wherein the metal contacts (BC, TC) further comprise a first metallic layer (BC) placed on the second face in contact with the second doped region.

3. The device according to claim 2, further comprising a first high doping well having doping of the second doping type (p+) included in the first doped region and extending to the second face; and a second high doping well having doping of the second doping type (p+) included in the layer in the second semiconductor material and contacting the doped layer in the second semiconductor material and contacting a first portion of the first high doping well at the second face.

4. The device according to claim 3, wherein the metal contacts (BC, TC) further comprise a second metal layer (TC) placed over a second portion of the first high doping well at the second face.

5. The device according to claim 3, wherein the metal contacts (BC, TC) comprise a third metal layer that covers the doped layer in the second semiconductor material and the second high doping well, contacting the first high doping well at the second face.

6. The device according to claim 2, wherein the metal contacts (BC, TC) comprise a fourth metal layer that covers the doped layer in the second semiconductor material, being spaced from the second face.

7. The device according to claim 2, further comprising a layer of electrically insulating material placed over the second face and the doped layer in the second semiconductor material; wherein the first metal layer extends internally to the layer of insulating material from the second face to a free face of the layer of insulating material forming a first contact pad; and wherein the metal contacts (BC, TC) comprise a fifth metal layer extending internally to the layer of insulating material from the second face to a free face of the layer of insulating material forming a second contact pad.

8. The device according to claim 1, wherein the first and/or second semiconductor material is chosen from a group comprising III-V semiconductors and their alloys, II-VI semiconductors and their alloys, and IV semiconductors and their alloys.

9. The device according to claim 1, wherein the first semiconductor material has associated a first band gap Eg1; and wherein the second semiconductor material has associated a second band gap Eg2 smaller than the first band gap Eg1.

10. The device according to claim 2, wherein the sensor device is configured to convert the incident electromagnetic radiation (EMR) into photo-detected electric current (Iph) as a function of a respective spectral responsivity dependent on a control electrical voltage (VB).

11. The device according to claim 10, wherein the metal contacts (BC, TC) define first (BC) and second (TC) electrical terminals to which the control electrical voltage (VB) is applicable and from which the photo-detected electric current (Iph) is readable.

12. The device (10) according to claim 1, wherein the first semiconductor materials and the second semiconductor materials are selected so that the sensor device operates in the visible, near-infrared, and the short-wave infrared.

13. The device according to claim 4, further including: a third high doping well having doping of the first type (p+) included in the first doped region and extending to the second face; and a further metal layer (FC) placed above the third high doping well at the second face defining a third electrical control terminal of the device.

14. An electromagnetic radiation detection system, comprising:
a sensor device to convert an incident electromagnetic radiation (EMR) into electrical current as a function of a respective spectral responsivity dependent on an adjusting electrical voltage ($V_B$), the sensor device being a double photodiode electromagnetic radiation sensor device comprising:
a substrate within a first semiconductor material defining a first face exposed to electromagnetic radiation (EMR) and a second face opposite the first face;
a first integrated photodiode (PD1) comprising:
a first doped region included in the substrate extending to the second face and having a first type doping (n); and
a second doped region included in the substrate extending to the second face, separated from the first doped region by a portion of the substrate, the second doped region having a doping of a second type (p+);
a second integrated photodiode (PD2) comprising the first doped region, and further comprising:
a layer in a second semiconductor material placed on the second face in contact with the first doped region and such as to define a third face opposed to the second face; and
a doped layer in the second semiconductor material having a doping of the second type (p+) and overlapping the third face;
a plurality of metal contacts (BC, TC) arranged to contact the second doped region, at the second face, and the doped layer; and
an electronic control and processing module;
wherein the electronic control and processing module selectively provides the sensor device with a plurality of adjusting electrical voltage values ($V_B$) adjusting the spectral responsivity so as to obtain a corresponding plurality of detected electric currents (Iph) associated with the incident electromagnetic radiation; and
wherein the electronic control and processing module processes values of such detected electric currents (Iph) basing on the adjusting electrical voltage values ($V_B$) and the spectral responsivity, obtaining information (SP-ANS; IPST-IM) related to the incident electromagnetic radiation.

15. The system according to claim 14, wherein the control and processing module further comprises, a reading module configured to receive the plurality of detected electrical currents (Iph) and convert it into a plurality of detected electrical voltages (Vph), a conditioning module configured to receive the plurality of detected electrical voltages (Vph) and convert it into corresponding digital detected values (Vphi), and an analysis device configured to receive the digital detected values (Vphi) and extrapolate spectrum information (SP-ANS; IPST-IM) of the incident electromagnetic radiation.

* * * * *